United States Patent [19]
Mehta et al.

[11] Patent Number: 6,028,789
[45] Date of Patent: Feb. 22, 2000

[54] ZERO-POWER CMOS NON-VOLATILE MEMORY CELL HAVING AN AVALANCHE INJECTION ELEMENT

[75] Inventors: Sunil D. Mehta; Brad Sharpe-Geisler, both of San Jose; Steven Fong, Santa Clara, all of Calif.

[73] Assignee: Vantis Corporation, Sunnyvale, Calif.

[21] Appl. No.: 09/334,051

[22] Filed: Jun. 15, 1999

[51] Int. Cl.[7] .................................................. G11C 16/04
[52] U.S. Cl. .................... 365/185.14; 365/185.1; 365/185.18; 365/185.27; 365/185.31; 365/187; 365/188; 257/318; 257/319; 257/320; 257/322
[58] Field of Search .......................... 365/185.1, 185.18, 365/185.14, 185.27, 185.31, 182, 187, 188; 257/318, 319, 320, 322; 326/45, 44

[56] References Cited

U.S. PATENT DOCUMENTS

| | | | |
|---|---|---|---|
| 5,101,378 | 3/1992 | Radjy et al. | 365/185.02 |
| 5,754,471 | 5/1998 | Peng et al. | 365/185.1 |
| 5,761,116 | 6/1998 | Li et al. | 365/185.1 |

*Primary Examiner*—Andrew Q. Tran
*Attorney, Agent, or Firm*—Brinks Hofer Gilson & Lione

[57] ABSTRACT

A zero-power non-volatile memory cell includes a control element, an avalanche injection element, and a CMOS inverter. A floating-gate electrode is capacitively coupled to the control element, the avalanche injection element, and to the CMOS inverter. The avalanche injection element is arranged, so as to transfer electrical charge onto the floating-gate electrode. The presence of stored data within the memory cell is indicated by reading a supply voltage $V_{DD}$ at an output terminal of the inverter. Accordingly, data can be read from the non-volatile memory cell without applying electrical power to the cell.

20 Claims, 4 Drawing Sheets

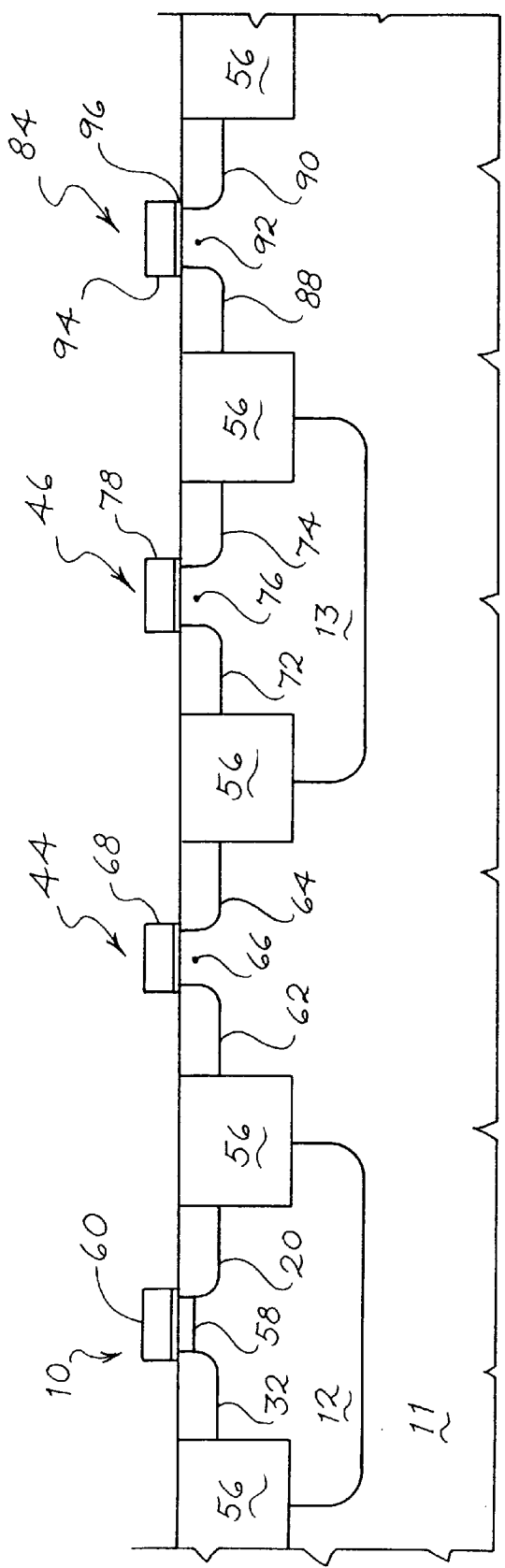

6,028,789

ZERO-POWER CMOS NON-VOLATILE MEMORY CELL HAVING AN AVALANCHE INJECTION ELEMENT

CROSS REFERENCE TO RELATED APPLICATIONS

Related subject matter is disclosed in commonly assigned co-pending patent application Ser. No. 09/217,648 filed Dec. 21, 1998, entitled "Floating Gate Memory Cell Structure with Programming Mechanism Outside the Read Path", now pending, the disclosure of which is incorporated by reference herein.

FIELD OF THE INVENTION

This invention relates, in general, to non-volatile memory devices, and more particularly, to EEPROM cells containing an avalanche injection element for programming.

BACKGROUND OF THE INVENTION

Many types of integrated circuit devices include non-volatile memory cells in order to increase the performance of the integrated circuits. To minimize the additional chip area required for the non-volatile memory cells, cell designers strive for designs which are compact and be reduced in size to match the dimensions of other circuit components within the integrated circuit device. Additionally, non-volatile memory cell designers seek to design non-volatile memory cells that are capable of operating at low power. By developing non-volatile memory cells capable of being programmed and erased at low power, the memory cells become more compatible with existing circuitry in electrically-erasable-programmable-read-only-memory (EEPROM) integrated circuit devices. For example, EEPROM cells typically require 13 to 15 volts for programming and erasing. This voltage level is considerably greater than the 1.8 to 3 volt operating potentials used by many integrated circuits.

Conventional programming and erasing of EEPROM devices is carried out by either hot carrier injection, or by Fowler-Nordheim tunneling. Both conventional programming and erasing methods require application of relatively high voltages to store and remove charge form the floating-gate transistor within the EEPROM cell. Reduced programming voltages can be obtained through the use of a Zener diode within the substrate immediately below the floating-gate electrode. Programming and erasing of an EEPROM cell having a Zener/avalanche diode can be carried out at voltage levels of about 6 to 8 volts. Accordingly, by incorporating an EEPROM device having a Zener/avalanche diode the EEPROM cell can be operated at low power and can be powered by a relatively small power supply.

Typically, an EEPROM cell having a Zener/avalanche diode comprises a source and drain region underlying a floating gate electrode. An implant region is included within the channel of opposite conductivity type to that of the source and drain. This creates a P-N junction in close proximity to the floating-gate electrode.

To program the Zener EEPROM cell, the P-N junction is reversed-biased to create an electric field of approximately $10^6$ volt/cm. The electric field generates energetic hot electrons that are injected across the dielectric layer separating the floating-gate from the channel region. A low junction break down voltage can be used for programming by optimizing the P-N junction depth and junction profile.

While the incorporation of Zener/avalanche structures in EEPROM memory cells has reduced the programming and erasing voltage levels necessary for cell operation, further improvements are necessary to fully realize the operational efficiency possible with this type of non-volatile memory cell. Improvements in the structure of individual cells will result in lower power devices that can be programmed and erased at relatively low voltage levels. Further development of EEPROM cells that incorporate sense transistors as part of the read path are needed to provide non-volatile memory cells capable of operation at very low power levels.

SUMMARY OF THE INVENTION

The present invention is for a non-volatile memory cell that includes an avalanche injection element for applying electrical charge to a floating-gate electrode, and an inverter that is activated by the floating-gate electrode. The avalanche injection element enables the non-volatile memory cell to be programmed and erased at relatively low voltages. Additionally, the incorporation of a CMOS inverter enables the memory cell to continuously output a high or low voltage level without consuming power. Accordingly, the non-volatile memory cell of the invention does not require continuous consumption of electrical power in the read path to determine the presence or absence of stored data in the memory cell.

In one form, a non-volatile memory cell arranged in accordance with the invention includes a control element, and avalanche injection element, a CMOS inverter, and a floating-gate electrode. The floating-gate electrode is capacitively coupled to the control element, the avalanche injection element, and to the CMOS inverter. The avalanche injection element is arranged in the non-volatile memory cell so as to transfer electrical charge onto the floating-gate electrode.

BRIEF DESCRIPTION OF THE DRAWING

FIG. 6 illustrates, in cross-section, the non-volatile memory cell illustrated in FIG. 5.

Figure 1:
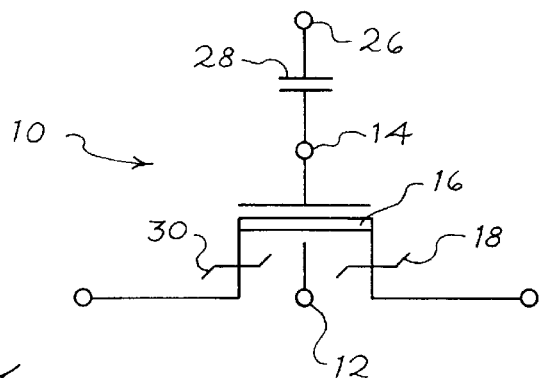
FIG. 1 is a schematic diagram of an avalanche injection element arranged in accordance with the invention.

It will be appreciated that for simplicity and clarity of illustration, elements shown in the Figures have not necessarily been drawn to scale. For example, the dimension of some of the elements are exaggerated relative to each other for clarity. Further, where considered appropriate, reference numerals have been repeated among the Figures to indicate corresponding elements.

DETAILED DESCRIPTION OF PREFERRED EMBODIMENTS

FIG. 1 illustrates, a schematic diagram of an avalanche injection element 10 formed in accordance with the preferred embodiment of the invention. As described below, the non-volatile memory cell of the invention is programmed and erased using hot carriers (hot electrons and hot holes) generated by Zener/avalanche breakdown. Preferably, avalanche injection element 10 is formed in an N-well 12. Electrons are transferred to a floating-gate electrode 14 through an oxide layer 16. Electron transfer is initiated by reverse biasing P-N junction 18. P-N junction 18 is created by P+ region 20 and N+ region 22.

Figure 2:
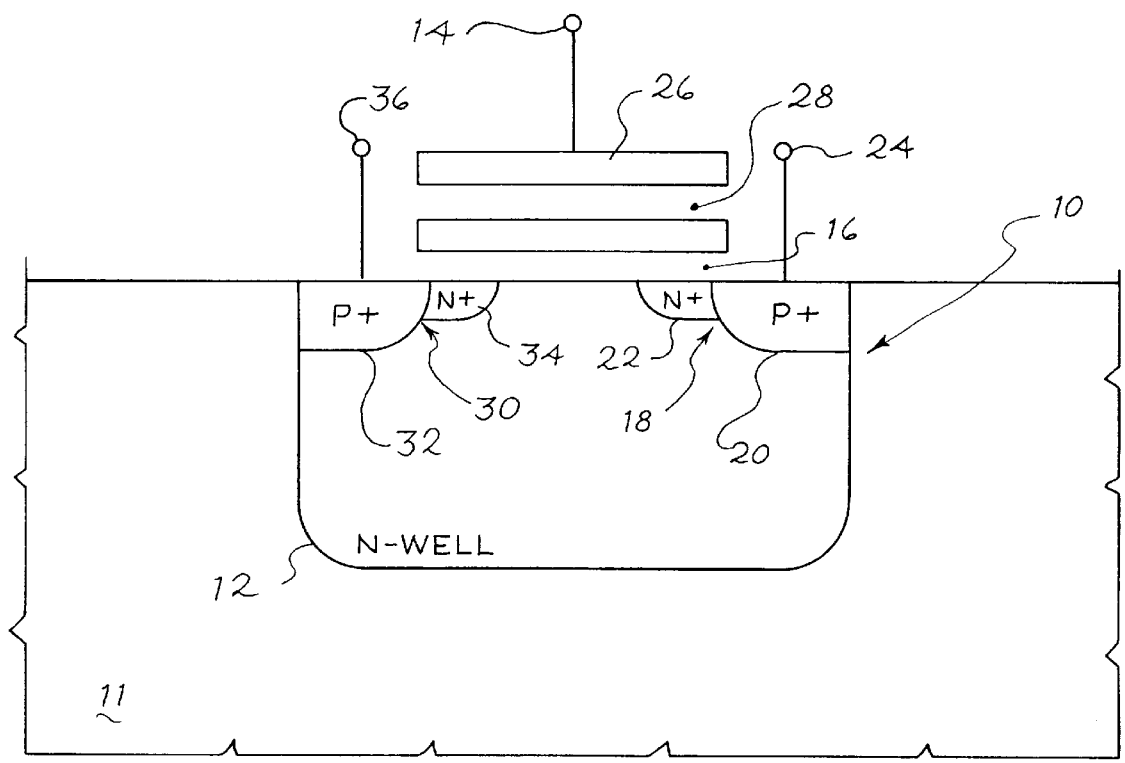
FIG. 2 illustrates, in cross-section, the avalanche injection element illustrated in FIG. 1.

Referring to FIG. 2, P-N junction 18 is reversed biased by applying, for example, 0 volts to terminal 24 and maintaining N-well region 20 at 8 volts. Additionally, a potential of, for example, 0 or 8 volts is coupled to floating-gate electrode 14 by a control element 26 depending on whether a programming or erase option is being carried out. In a preferred embodiment, control element 26 is formed by doping a region of a semiconductor substrate 11 that supports N-well region 12. Alternatively, control element 26 can be a polycrystalline silicon gate electrode overlying floating-gate electrode 14. In either embodiment, control element 26 is capacitively coupled to floating-gate 14 by a dielectric material 28.

Upon application of the appropriate voltages, hot electrons generated by reverse biasing P-N junction 18 are injected into floating-gate electrode 14. Hot holes are injected into floating-gate electrode 14 by reverse biasing P-N junction 30 and applying 0 volts to the control gate and 8 volts to N-well region 12. P-N junction 30 is created by forming P+ region 32 and N+ region 34. P-N junction 30 is reversed biased by applying, for example 0 volts to terminal 36, and maintaining N-well region 12 at 8 volts. A low or 0 voltage is coupled to floating-gate electrode 14 by control element 26 so that hot holes are injected through oxide layer 16.

By injecting hot electrons and hot holes through two different areas of oxide layer 16, oxide degradation attributed to repeated charge transfer is minimized. Those skilled in the art will recognize that charge leakage caused by oxide degradation is a leading failure mechanism in non-volatile memory devices. Although avalanche injection element 10 has been described with references to regions having a specific conductivity type, those skilled in the art will appreciate that avalanche injection element 10 can be formed by employing regions of opposite conductivity type to that illustrated in FIG. 2. Further, those skilled in the art will recognize that the present invention can be realized using a single-sided avalanche injection element, rather than the two-sided element illustrated in FIG. 2. An alternative embodiment with a single-sided P/N junction can be used if programming and erase is done in the same area of oxide layer 16.

Figure 3:
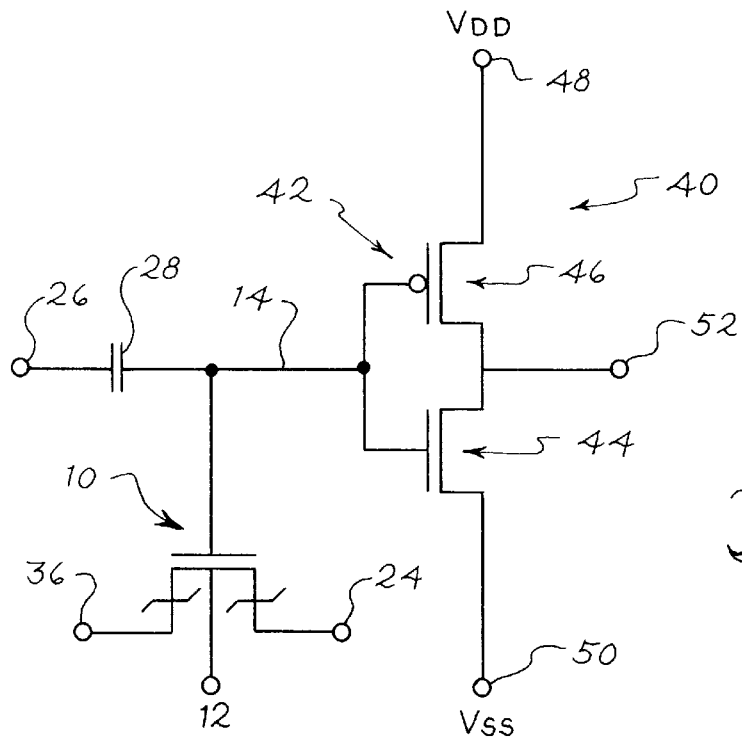
FIG. 3 is a schematic diagram of a non-volatile memory cell arranged in accordance with one embodiment of the invention.

FIG. 3 illustrates a schematic diagram of a non-volatile memory cell 40 formed in accordance with one embodiment of the invention. Non-volatile memory cell 40 includes avalanche injection element 10 coupled to a CMOS inverter 42. CMOS inverter 42 includes an NMOS transistor 44 electrically coupled to a PMOS transistor 46. Floating-gate electrode14 is capacitively coupled to avalanche injection element 10, control element 26, and to NMOS transistor 44 and PMOS transistor 46. CMOS inverter 42 is connected to supply voltage $V_{DD}$ at terminal 48 and to ground potential $V_{SS}$ at terminal 50. CMOS inverter 42 outputs either voltage $V_{DD}$ or voltage $V_{SS}$ at output terminal 52 depending upon the presence or absence of charge on floating-gate electrode 14.

In operation, data is stored in non-volatile memory cell 40 by applying appropriate programming voltages, such that avalanche injection element 10 injects holes into floating-gate electrode 14. The injection of holes into floating-gate electrode 14 creates a positive voltage that turns NMOS transistor 44 on and turns PMOS transistor 46 off. Accordingly, in a programmed condition the positive charge placed on floating-gate electrode 14 causes voltage $V_{SS}$ to appear at output terminal 52 of inverter 42.

Non-volatile memory cell 40 can be erased by applying appropriate voltage levels, such that avalanche injection element 10 injects electrons into floating-gate electrode 14. The injection of negative charge creates a negative voltage potential that turns NMOS transistor 44 off and PMOS transistor 46 on. The erased condition of non-volatile memory cell 10 causes voltage $V_{vd}$ to appear at output terminal 52.

Figure 4:
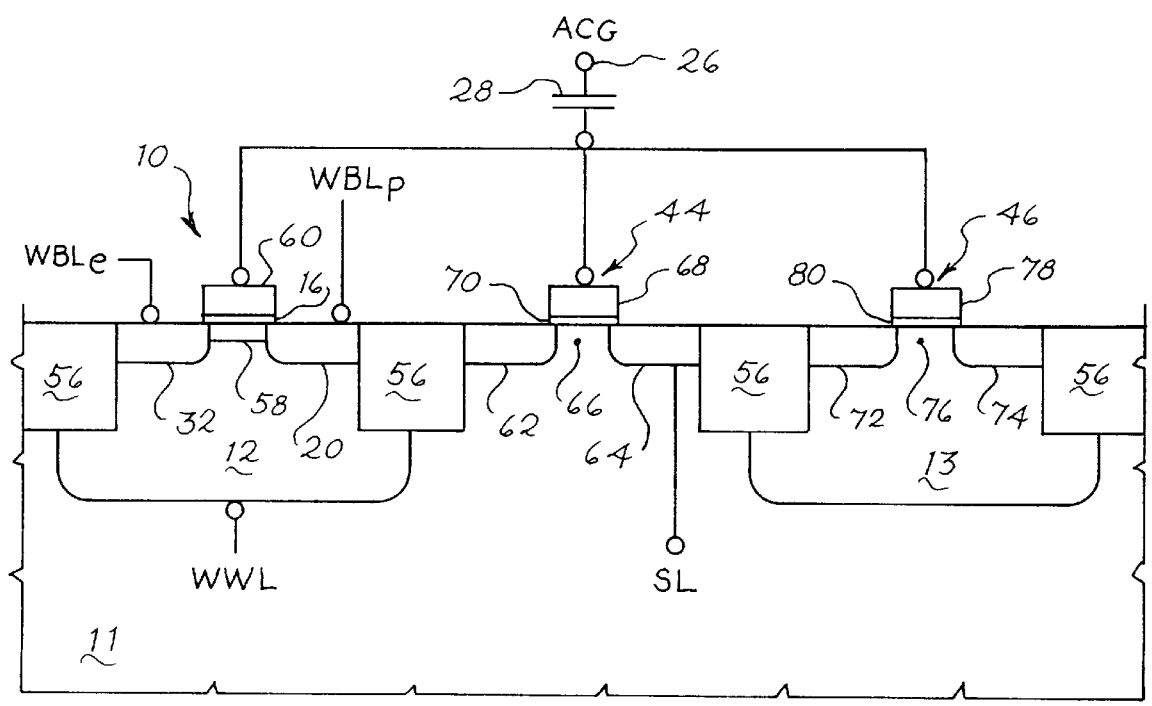
FIG. 4 illustrates, in cross-section, the non-volatile memory cell illustrated in FIG. 3.

FIG. 4 illustrates, in cross-section, non-volatile memory cell 40 formed in a semi-conductor substrate 11. Trench isolation regions 56 electrically isolate avalanche injection element 10 from NMOS transistor 44 and PMOS transistor 46. Additionally, trench isolation regions 56 electrically isolate NMOS transistor 44 and PMOS transistor 46. Avalanche injection element 10 includes P+ source and drain regions 32 and 20 formed in an N-well region 12. An array control gate (ACG) can function as control element 26. Typically the ACG is a highly doped n-type region formed in substrate 11.

An alternative embodiment of a channel doping region for the formation of P-N junctions 18 and 30 is illustrated in FIG. 4. In the alternative embodiment, a doped region 58 is formed across the entire length of the channel region separating drain region 20 from source region 32. A portion 60 of floating-gate electrode 14 overlies doped region 58 and is separated therefrom by oxide layer 16.

NMOS transistor 44 includes a source region 62 and a drain region 64 separated by a channel region 66. A portion 68 of floating-gate electrode 14 overlies channel region 66 and is separated therefrom by a gate dielectric layer 70.

PMOS transistor 46 includes a drain region 72 and a source region 74 separated by a channel region 76. Drain regions 72, source region 74, and channel region 76 reside in a second N-well region 13. A portion 78 of floating-gate electrode 14 overlies channel region 76 and is separated therefrom by a gate dielectric layer 80. Drain region 64 of NMOS transistor 44 is electrically coupled to drain region 72 of PMOS transistor 46 by a metal lead (not shown).

Those skilled in the art will appreciate that the particular arrangement of non-volatile memory cell 40 illustrated in FIG. 4 is only one possible arrangement of the operative components of the non-volatile memory cell of the invention. Additionally, the conductivity type of the components illustrated in FIG. 4 can be reversed. For example, substrate 11 can have an N-type conductivity and well regions 12 and 13 can have a P-type conductivity. In that case, the relative position of NMOS transistor 14 and PMOS transistor 46 will be reversed from that illustrated in FIG. 4. Additionally, opposite voltage potentials can be applied to avalanche injection element 10 the reverse bias the P-N junctions formed therein. Accordingly, all such variations and modifications are within the scope of the present invention.

Non-volatile memory cell 40 can be implemented in a non-volatile memory array, such as an EEPROM array. In an EEPROM array, the terminals of non-volatile memory cell 40 are electrically coupled to electrical lines and gates in order to operate and control the functions of an EEPROM memory cell. In an EEPROM implementation, an erase write bit line ($WBL_e$) is electrically coupled to source region 32 of avalanche injection element 10, a program write bit line ($WBL_p$) is electrically coupled to drain region 20 of avalanche injection element 10, and a write word line (WWL) is electrically coupled to N-well region 12. An array control gate (ACG) is capacitively coupled to floating-gate electrode 14 by capacitor 28. A sense line (SL) is electrically coupled to either drain region 64 of NMOS transistor 44, or drain region 72 of PMOS transistor 46.

The programming, erase and read operation of the cell is described in the following table.

TABLE I

|  | WBLe (24) | WBLp (36) | WWL (12) | ACG (26) | Source (P) (48) | Source (N) (50) |
|---|---|---|---|---|---|---|
| Program | Floating | 0 v | 8 v | 0 | Floating | Floating |
| Erase | 0 | Floating | 8 v | ≧8 | Floating | Floating |
| Read | Floating | Floating | Floating | $V_{DD}$ | $V_{DD}$ | $V_{SS}$ |

For unselected cells in the same row or column as the selected cell, the WBLp, WBLe and WWL settings are selected appropriately to ensure that approximately $V_{pp}/2$, where $V_{pp}$ is the programming voltage (in this case, 4 V), appears across the P/N junction on the unselected cells.

Variations of the cells described in FIGS. 3 and 4 and Table I are possible. For example, an N-P junction instead of a P-N junction can be used, and the high and low voltages for WBL and WWL in Table I are interchanged. Also, a single-sided P-N or N-P junction may be used, so that node 24 in FIG. 3 is used for both programming and erase and node 36 is floating. In such cases, node 12 (WWL) may also be eliminated, and node 36 used to forward bias the P-N junction 32 and thereby apply a bias to the n-well.

Figure 5:
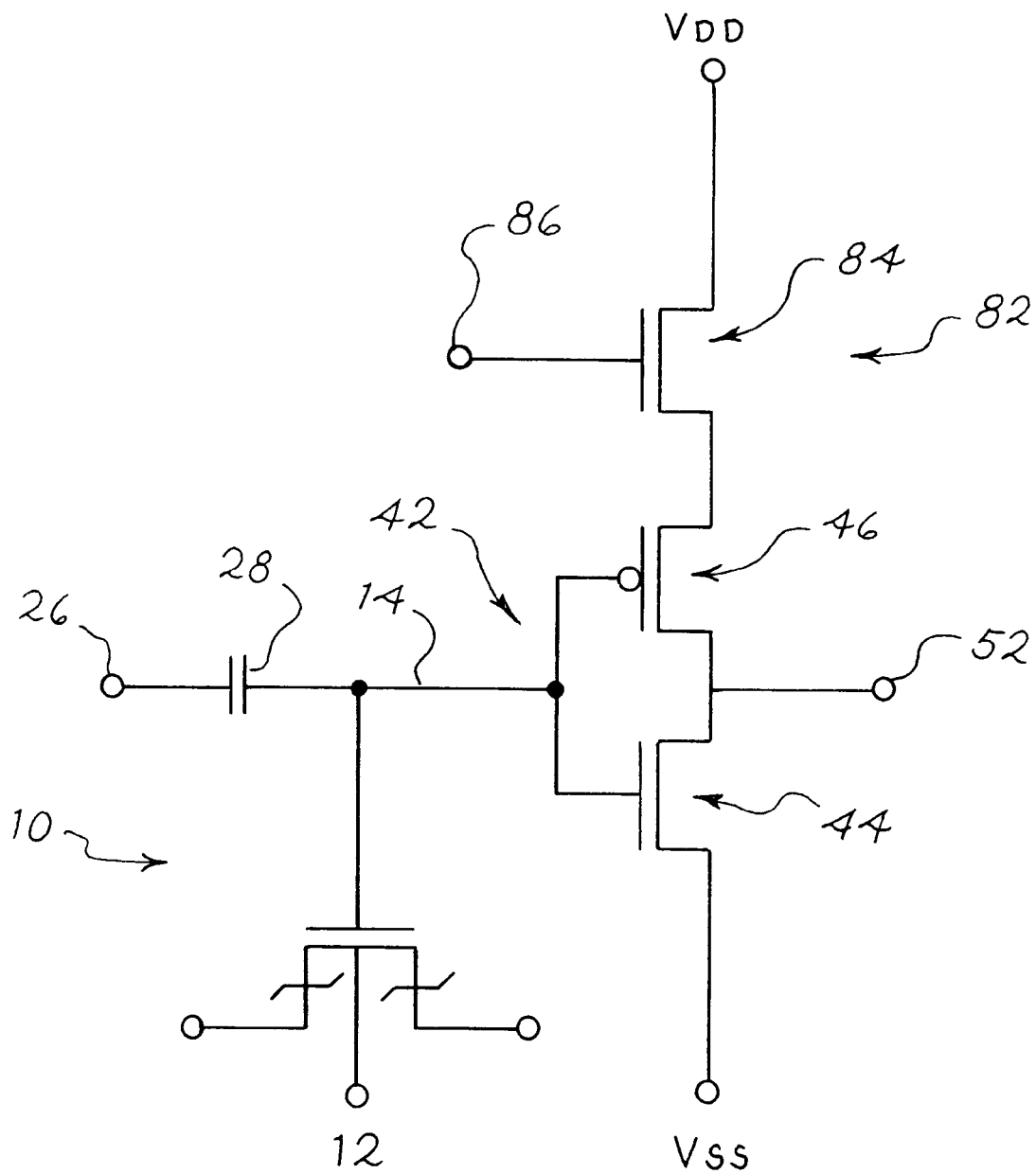
FIG. 5 is a schematic diagram of a non-volatile memory cell arranged in accordance with another embodiment of the invention.

Schematic diagram of a non-volatile memory cell 82 formed in accordance with an alternative embodiment of the invention is illustrated in FIG. 5. In addition to avalanche injection element 10 and inverter 42, non-volatile memory cell 82 also includes a select transistor 84. Select transistor 84 electrically couples PMOS transistor 46 to supply voltage $V_{DD}$. Select transistor 84 is activated by coupling the gate electrode to a word line 86. Select transistor 84 is useful for implementing non-volatile memory cell 82 in a complex-programmable logic-device (CPLD). As in the previous embodiment, a positive charge on floating-gate electrode 14 will cause ground voltage $V_{SS}$ to appear at output terminal 52. In accordance with the alternative embodiment, application of a negative potential to floating-gate electrode 14 will not cause supply voltage $V_{DD}$ to appear at output terminal 52 unless select transistor 84 is turned on. In this manner, individual cells within a CPLD can be selectively activated by application of a turn-on voltage to word line 86.

In FIG. 5, depending on the technology, there may be insufficient floating-gate voltage to turn off the PMOS device 46 completely. The source of the PMOS transistor 46 will need to be controlled so that the floating gate voltage in the erased state is high enough to completely turn off the transistor. This can be done by controlling the gate voltage of access transistor 84. In order to accomplish this, a voltage lower than $V_{DD}$ should be applied to node 86. In this manner, zero-power operation cells can always be achieved in any technology. Note that in all cases, the preferred ACG voltage (node 26) is half of the source voltage of the PMOS transistor 46 during a read operation.

Non-volatile memory cell 82 is illustrated in cross-section in FIG. 6. Select transistor 84 is formed in semiconductor substrate 11 and is isolated from PMOS transistor 46 by isolation regions 56. Select transistor 84 includes a source region 88 and a drain region 90 separated by a channel region 92. A gate electrode 94 overlies channel region 92 and is separated therefrom by a gate dielectric layer 96. Source region 88 of sense transistor 84 is electrically coupled to source region 74 of PMOS transistor 46 by a metal lead (not shown). Non-volatile memory cell 82 can be incorporated into an EEPROM memory array in a manner analogous to that described and illustrated with reference to non-volatile memory cell 40.

Thus it is apparent that there has been described, in accordance with the invention, a zero-power CMOS non-volatile memory cell having an avalanche injection element that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, various types of avalanche programming elements can be included, such as those having a single P-N junction, and the like. It is therefore intended to include within the invention all such variations and modifications as fall within the scope of the appended claims and equivalents thereof.

We claim:

1. A non-volatile cell comprising:
   a control element;
   an avalanche injection element;
   a CMOS inverter; and
   a floating-gate electrode capacitively coupled to the control element, the avalanche injection element, and to the CMOS inverter,
   wherein the avalanche injection element is arranged so as to transfer electrical charge onto the floating gate electrode.

2. The cell of claim 1, wherein the avalanche injection element comprises a source region and a drain region of a first conductivity type separated by a channel region therebetween, wherein the source, drain, and channel regions reside in a well region doped to have a second conductivity type.

3. The cell of claim 2, wherein the well region is operatively coupled to a control voltage, and wherein the channel region includes a doped region adjacent to the drain region.

4. The cell of claim 2, wherein the well region is operatively coupled to a control voltage, and wherein the channel region includes a first doped region adjacent to the source region and a second doped region adjacent to the drain region.

5. The cell of claim 1, wherein the CMOS inverter comprises an NMOS transistor electrically coupled to a PMOS transistor, and wherein the CMOS inverter is located in a read path of an EEPROM array.

6. The cell of claim 5, wherein the NMOS transistor comprises a source region electrically coupled to a product term gate, and wherein the PMOS transistor comprises a source region electrically coupled to a bit line.

7. The cell of claim 1 further comprising a read transistor electrically coupled to the CMOS inverter.

8. The cell of claim 1, wherein the avalanche injection element comprises a reverse-biased junction positioned so as to inject electrical charge selected from the group consisting of hot electrons and hot holes into the floating-gate electrode.

9. A non-volatile cell comprising:
   a substrate of a first conductivity type;
   first and second well regions of a second conductivity type in the substrate;

a avalanche injection element located in the first well region;

a first transistor having a source and a drain region of the second conductivity type;

a second transistor having a source and drain region of the first conductivity type located in the second well region, wherein the drain region of the first transistor is electrically coupled to the drain region of the second transistor, and wherein the avalanche injection element is electrically isolated from the first and second transistors; and a floating-gate electrode capacitively couple to the first transistor, the second transistor, and to the avalanche injection element.

10. The cell of claim 9, wherein the avalanche injection element comprises a source region and a drain region of the first conductivity type separated by a channel region therebetween, wherein the source, drain, and channel regions reside in said first well region doped to have the second conductivity type.

11. The cell of claim 10, wherein the first well region is operatively coupled to a control voltage, and wherein the channel region includes a doped region adjacent to the drain region.

12. The cell of claim 10, wherein the first well region is operatively coupled to a control voltage, and wherein the channel region includes a first doped region adjacent to the source region and a second doped region adjacent to the drain region.

13. The cell of claim 9, wherein the avalanche injection element comprises a reverse-biased junction positioned so as to inject electrical charge selected from the group consisting of hot electrons and hot holes into the floating-gate electrode.

14. The cell of claim 9, further comprising a third transistor having a source region of the second conductivity type electrically coupled to the source region of the second transistor.

15. A non-volatile memory cell comprising:

a semiconductor substrate, having a well region therein;

an avalanche injection element having a reverse-biased junction in the well region;

a CMOS inverter;

a control element;

a floating-gate electrode capacitively coupled to the avalanche injection element, the CMOS inverter, and to the control element, wherein electrical charge is transferred to the floating-gate from the avalanche injection element upon application of a voltage bias to the well region and a program/erase voltage to the control element.

16. The cell of claim 15, wherein the CMOS inverter comprises an NMOS transistor electrically coupled to a PMOS transistor, and wherein the CMOS inverter is located in a read path of a non-volatile memory array.

17. The cell of claim 15 further comprising a read transistor electrically coupled to the CMOS inverter.

18. The cell of claim 17, wherein the read transistor is electrically coupled to a PMOS transistor.

19. The cell of claim 18, wherein the read transistor electrically couples a supply voltage to the CMOS inverter.

20. The cell of claim 15, wherein the reverse-biased junction is positioned so as to inject electrical charge selected from the group consisting of hot electrons and hot holes into the floating-gate electrode.

* * * * *